United States Patent
Krüger et al.

(12)

(10) Patent No.: US 6,485,871 B1
(45) Date of Patent: Nov. 26, 2002

(54) METHOD OF PRODUCING PHASE MASKS IN AN AUTOMATED LAYOUT GENERATION FOR INTEGRATED CIRCUITS

(75) Inventors: Thomas Krüger, Planegg; Werner Schiele, München, both of (DE)

(73) Assignee: Infineon Technologies AG, Munich (DE)

( * ) Notice: Subject to any disclaimer, the term of this patent is extended or adjusted under 35 U.S.C. 154(b) by 29 days.

(21) Appl. No.: 09/677,546

(22) Filed: Oct. 2, 2000

(30) Foreign Application Priority Data

Sep. 30, 1999 (DE) .......................... 199 46 991

(51) Int. Cl.⁷ .......................... G03F 9/00; G06F 17/50
(52) U.S. Cl. .......................... 430/5; 716/21
(58) Field of Search .......................... 430/5, 322; 716/19, 716/20, 21; 395/500.2

(56) References Cited

U.S. PATENT DOCUMENTS 6,083,275 A * 7/2000 Heng et al. .................... 716/19
6,330,708 B1 * 12/2001 Parker et al. .................. 716/19

FOREIGN PATENT DOCUMENTS

DE 196 25 894 A1 1/1997
DE 196 42 050 A1 4/1997

OTHER PUBLICATIONS

Kazuko Oii et al.: "Method of Designing Phase–Shifting Masks Utilizing a Compactor", Jpn. J. Appl. Phys., vol. 33 (1994), pp. 6774–6778.

* cited by examiner

Primary Examiner—S. Rosasco
(74) Attorney, Agent, or Firm—Laurence A. Greenberg; Werner H. Stemer; Gregory L. Mayback

(57) ABSTRACT

A method of producing phase masks for automatically generating a layout for an integrated circuit includes the step of compacting a layout of an integrated circuit by processing a distance graph. A respective phase is allocated to at least some of a plurality of polygons in the layout in order to generate a phase mask, wherein the allocating step is performed during the processing of the distance graph.

11 Claims, No Drawings

METHOD OF PRODUCING PHASE MASKS IN AN AUTOMATED LAYOUT GENERATION FOR INTEGRATED CIRCUITS

BACKGROUND OF THE INVENTION

Field of the Invention

The present invention relates to a method for producing phase masks during an automated process of generating a layout of an integrated circuit.

A main object when generating a layout of integrated circuits is always to accommodate as many circuit elements as possible on as small an area as possible in order to increase the speed at which the integrated circuits operate. At the same time costs are reduced, since costs depend to a considerable extent on the area of the integrated circuit. However, at the same time, specific technology-dependent minimum separations or spacing distances must be maintained between different conductive areas on the integrated circuit. These conductive areas are normally in the form of a polygon.

The use of phase masks in the manufacture of integrated circuits allows the chip designer to place layout polygons, in other words conductive areas on a specific plane in the integrated circuit, closer to one another than polygons having the same phase, which are normally referred to as polygons "of the same color." For simplicity, the polygons in a phase mask are regarded as having different colors for respective phases.

In order to minimize the area of the integrated circuit, it is thus worthwhile to plan or select the coloring of the polygons, that is to say the phase allocation, such that (at least in areas in which the relevant mask plane is critical for area consumption), as far as possible, only polygons "of different color", that is to say polygons of different phases, are adjacent.

In the prior art, little use has so far been made of this potential for saving layout areas. Several methods, which color the polygons "alternately" with regard to their two-dimensional extent, are used. Manual optimization processes can also be carried out, of course, for relatively small layout blocks.

The prior art on which the present application is based is described in the book "Leaf cell and hierarchical compaction techniques" by Cyrus Bamji and Ravi Varadarajan, Boston, Kluwer Academic Publishers, 1997. This book provides a good overview of the most important methods and latest developments in the field of layout compacting.

Prior art methods which are related to the method according to the invention can be found in the article "Method of Designing Phase-Shifting Masks Utilizing a Compactor" by K. Ooi, K. Koyama and M. Kiryu, Japanese Journal of Applied Physics, Volume 33, pages 6774–6778, 1994. Kazuko et al. integrate the phase allocation and layout compacting in a joint overall sequence. However, the phase masks are not generated directly during the compacting process, so that it is impossible to find the optimum allocation with regard to the area optimization result.

A further related prior art method can be found in the article "Insertion of Jog Series in Layout Compaction" by W. L. Schiele, Th. Krueger and M. C. Utesch, in the journal "Integration", Volume 16, No. 2, pages 149–162, 1993. This article describes a method for introducing bends or jog points. The bending of lines or introduction of jog points in the layout can lead to a considerable reduction in area. The method described optimizes a graph, to which a longest path algorithm has previously been applied.

Published, Non-Prosecuted German Patent Application DE 196 25 894 A1 describes a method for producing photo masks, in which optical proximity effects are corrected by using a predetermined correction method to correct scanning data which are produced on the basis of mask data received from outside. The corrected scanning data are used to control a pattern exposure process for producing the pattern of a photo mask.

According to Published, Non-Prosecuted German Patent Application DE 196 42 050 A1, the packing density of a circuit is increased by using a phase-shifting mask which is formed of alternately configured phase shifters.

SUMMARY OF THE INVENTION

It is accordingly an object of the invention to provide a method of producing phase masks which overcomes the above-mentioned disadvantages of the heretofore-known methods of this general type and which achieves an optimum allocation of the phases to the individual polygons.

With the foregoing and other objects in view there is provided, in accordance with the invention, a method of producing phase masks for automatically generating a layout for an integrated circuit, which includes:

compacting a layout of an integrated circuit by processing a distance graph;

allocating a respective phase to at least some of a plurality of polygons in the layout for generating a phase mask; and performing the allocating step during the processing of the distance graph.

In other words, the object of the invention is achieved in that the allocation takes place at least partially during the processing of the distance graph, that is to say at the same point in the compacting algorithm at which the jog points or the bending of lines is introduced according to the prior art from Schiele et al. According to the invention, the phase allocation can in this case be used as an alternative to or in addition to the introduction of bends or jog points.

It is particularly preferable in this case if the allocation of at least some of the polygons is carried out during the course of the longest path algorithm.

In accordance with another mode of the invention, the respective phase is allocated to given ones of the polygons having no allocated phase yet, if a longest path can be further shortened with the longest path algorithm.

It is particularly preferred, that polygons are allocated different phases only when these polygons have already achieved the minimum separation or distance between polygons of the same phase.

These features of the invention make sure that limitations in the design options, which would later prevent an optimum allocation, are not introduced prematurely by an unnecessarily early definition of the phase of the individual polygons.

It is therefore particularly preferable for some of the polygons to be allocated the phases only in later steps.

Some of the polygons are preferably allocated a phase only after the automatic jog point generation.

It is furthermore preferable for some of the polygons to be allocated a phase only in later compacting steps, for example during the alternate one-dimensional compacting in the X and Y directions.

Finally, it may be advantageous for some of the polygons to be allocated a phase only in an independent method separate from the layout compacting.

Other features which are considered as characteristic for the invention are set forth in the appended claims.

Although the invention is illustrated and described herein as embodied in a method of producing phase masks for automatically generating a layout for an integrated circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments.

DESCRIPTION OF THE PREFERRED EMBODIMENTS

The method according to the invention processes the distance graph. In the course of the longest path algorithm, previously uncolored polygons are colored in an appropriate manner until the longest path can no longer be shortened any further in this way. In this case, "in an appropriate manner" means, for example, the different coloring of polygons which are adjacent in the path and for which the generally permissible minimum distance or separation—even with the same color—has already been achieved.

Polygons which are still uncolored remain flexible and are colored in later steps. This is preferably done after an automatic jog point generation which, in fact, can be carried out in an entirely similar manner at this point in the program sequence (see the prior art from Schiele et al.). Likewise, some of the polygons which still remain uncolored can be colored in later compacting steps, for example during the alternate one-dimensional compacting in the X and Y directions.

Thus, according to the invention, the coloring process is carried out automatically and step-by-step during layout compacting. The particular advantage of the invention is that it is known in each step during the compacting process where the assigning of a color must in each case be carried out and where it is not yet worthwhile to assign a color, in order to achieve the maximum possible saving in the overall area of the layout. In contrast to the phase allocation methods according to the prior art, the layout compacting process according to the invention results in the best possible phase allocation combined with an improved optimization of the layout area.

We claim:

1. A method of producing phase masks for automatically generating a layout for an integrated circuit, the method which comprises;

compacting a layout of an integrated circuit by processing a distance graph by applying a longest path algorithm;

allocating a respective phase to at least some of a plurality of polygons in the layout for generating a phase mask by, if a longest path can be further shortened with the longest path algorithm, then allocating the respective phase to given ones of the polygons having no allocated phase yet, and if a minimum distance between specific ones of the polygons having an identical phase is achieved, then allocating respective different phases to the specific ones of the polygons; and performing the allocating step during the processing of the distance graph by applying the longest path algorithm.

2. The method according to claim 1, which comprises:

performing the allocating step as a first allocating step; and allocating, in at least a second allocating step subsequent to the first allocating step, the respective phase to given ones of the polygons.

3. The method according to claim 1, which comprises:

performing the allocating step as a first allocating step;

automatically generating jog points in the layout; and allocating the respective phase to given ones of the polygons after the step of generating the jog points.

4. The method according to claim 1, which comprises:

performing a further compacting step for optimizing the layout subsequent to the allocating step; and allocating, in a further allocating step, the respective phase to further ones of the polygons during the further compacting step.

5. The method according to claim 1, which comprises:

performing an alternate one-dimensional compacting in given X and Y directions for optimizing the layout subsequent to the allocating step; and allocating, in a further allocating step, the respective phase to further ones of the polygons during the alternate one-dimensional compacting step.

6. The method according to claim 1, which comprises allocating the respective phase to specific ones of the polygons in a further allocating step separate from the compacting step.

7. A method for producing phase masks for an automated design of integrated circuits, the method which comprises:

compacting a layout of an integrated circuit by processing a separation graph by applying a longest path algorithm;

allocating a respective phase to at least some of a plurality of polygons in the design by, allocating a phase to polygons having no allocated phase yet, as long as a longest path can still be shortened, and allocating different phases, if a minimum separation for polygons of the same phase already been achieved; and performing the allocating step at least partially during the processing of the separation graph by applying the longest path algorithm.

8. The method according to claims 7, wherein some of the polygons are allocated the phases only in later steps.

9. The method according to claim 8, wherein some of the polygons are allocated a phase only after an automatic jog point generation.

10. The method according to claim 8, wherein some of the polygons are allocated a phase only in later compacting steps, such as during the alternate one-dimensional compacting in the X and Y directions.

11. The method according to claim 8, wherein some of the polygons are allocated a phase only in an independent method, separate from layout compacting.

* * * * *